(12) United States Patent
Tan

(10) Patent No.: US 7,372,329 B1
(45) Date of Patent: May 13, 2008

(54) METHOD AND APPARATUS TO REMOVE THE DC COMPONENT OF A FEEDBACK SIGNAL

(75) Inventor: Ben Wee-Guan Tan, Singapore (SG)

(73) Assignee: Marvell International Ltd. (BM)

( * ) Notice: Subject to any disclaimer, the term of this patent is extended or adjusted under 35 U.S.C. 154(b) by 36 days.

(21) Appl. No.: 11/505,555

(22) Filed: Aug. 16, 2006

Related U.S. Application Data

(60) Provisional application No. 60/771,552, filed on Feb. 8, 2006.

(51) Int. Cl.
*H03F 3/45* (2006.01)

(52) U.S. Cl. .......................... 330/253; 330/86; 330/260

(58) Field of Classification Search ................ 330/85, 330/110, 144, 253, 259, 260, 282, 284; 360/46, 360/66–68
See application file for complete search history.

(56) References Cited

U.S. PATENT DOCUMENTS 5,410,271 A * 4/1995 Arbel .......................... 330/260
6,825,717 B2 * 11/2004 Dettmann .................... 330/86
7,276,969 B1 * 10/2007 Aram .......................... 330/253

* cited by examiner

*Primary Examiner*—Khanh Van Nguyen

(57) ABSTRACT

A feedback circuit disposed across input and output terminals of an amplifier is adapted so as not inject DC current back into the input terminal of the amplifier. The feedback circuit includes, in part, first and second current sources, a transistor, and a resistive load. The first current source supplies current to one of the terminals of the transistor in communication with an input terminal of the amplifier. The second current source receives this current and diverts it to a voltage supply. The transistor is maintained in the active region of operation. The resistive load has a first terminal in communication with an output terminal of the amplifier and a second terminal in communication with the transistor. The DC voltages at the two terminals of the resistive load are substantially equal so as to inhibit DC current flow therethrough.

35 Claims, 6 Drawing Sheets

METHOD AND APPARATUS TO REMOVE THE DC COMPONENT OF A FEEDBACK SIGNAL

CROSS-REFERENCES TO RELATED APPLICATIONS

The present application claims benefit under 35 USC 119(e) of U.S. provisional Application No. 60/771,552, filed Feb. 8, 2006, entitled "Method to Remove the DC Component of the Feedback Signal In a Transimpedance Amplifier", the content of which is incorporated herein by reference in its entirety.

BACKGROUND OF THE INVENTION

The present invention relates to electronic circuits, and more particularly to minimization of DC component of a feedback signal in an amplifier.

FIG. 1 shows a transimpedance amplifier 10, as known in the prior art. Resistor 16 represents the resistance of a sensor, such as a reader head (not shown), and resistor 14—shown using the dotted line—represents the output impedance of amplifier 10. Transimpedance amplifier 10 is adapted to amplify and convert the current signal generated by resistor 16 into a voltage signal $V_{OUT}$. The DC operating point of the reader head is ideally established by the biasing current source 18 only. However, the DC component of the feedback current signal $I_{FB}$ also contributes to and thus disturbs the DC operating point of the reader head via node N1.

The input impedance $R_{in}$ as seen from input node N1 is approximately defined by the following expression:

$$R_{in} = \frac{1}{G_m} + \frac{R_{12}}{1 + Gm \times R_{14}} \quad (1)$$

where $G_m$ is the voltage-to-current gain of transimpedance amplifier 10. Similarly, the output impedance $R_{out}$ as seen from input node N2 is approximately defined by the following expression:

$$R_{out} = \frac{1}{G_m} \quad (2)$$

The closed-loop voltage-to-current gain $$\frac{V_{out}}{I_{in}}$$

of amplifier 10 is defined by the following expression:

$$\frac{V_{out}}{I_{in}} = -R_{12} \quad (3)$$

One conventional technique for reducing the above-described disturbance of the DC operating point of the reader head is to sense or estimate the input voltage $V_{in}$ and use the sensed or estimated voltage to reduce the flow of the feedback current $I_{FB}$ to node N1. To sense the input voltage $V_{in}$, a control loop with a negative feedback is used. Such control loops are often complex and need to be carefully designed to remain stable during operation. Furthermore, amplifier 10 may need to be modified to accommodate such control loops. Currently known estimating techniques for estimating voltage $V_{in}$ also suffer from inaccuracies and thus may not reduce the flow of feedback current $I_{FB}$ to node N1 under all required operating conditions. A need continues to exist for a feedback circuit disposed across an amplifier that does not disturb the DC operating point of the input circuitry of the amplifier and that does not degrade the small-signal operation of the amplifier.

BRIEF SUMMARY OF THE INVENTION

In accordance with one embodiment of the present invention, a feedback circuit used in an amplifier includes, in part, first and second current sources, a transistor, and a resistive load. The first current source supplies current to one of the terminals of the transistor that is in communication with an input terminal of the amplifier. The second current source receives this current from another terminal of the transistor and diverts this current to a voltage source. The transistor is optionally maintained in the active region of operation. The resistive load has a first terminal in communication with an output terminal of the amplifier and a second terminal in communication with the transistor. The DC voltages at the terminals of the resistive load are characterized substantially by the same value so as to inhibit DC current flow through the resistive load. The voltage source to which the current is diverted to may be at the ground potential.

In one embodiment, the transistor is an MOS transistor. In another embodiment, the transistor is a bipolar transistor. The resistive load may be resistor, an MOS transistor or a bipolar transistor. The amplifier may be a transimpedance amplifier used in a sensor. The sensor may be the reader head, of a data storage media driver.

In accordance with another embodiment of the present invention, a method of reducing the DC component of a feedback signal generated by a feedback circuit disposed across input and output terminals of an amplifier includes, in part, supplying a current to a first terminal of a transistor maintained in communication with an input terminal of the amplifier; flowing the current received from a second terminal of the transistor to a voltage source; and maintaining substantially equal voltages across first and second terminals of a resistive load disposed between the second terminal of the transistor and the output terminal of the amplifier. The voltage source receiving the current may be at the ground potential. The method further includes maintaining the transistor in an active region of the operation.

In one embodiment, the transistor is an MOS transistor. In another embodiment, the transistor may be a bipolar transistor. The resistive load may be resistor, an MOS transistor or a bipolar transistor. The amplifier may be a transimpedance amplifier used in a sensor. The sensor may be the reader head of a data storage media driver.

In accordance with another embodiment of the present invention, a feedback circuit in communication with an amplifier includes, in part, means for supplying a current to a first terminal of a transistor; means for flowing the current received from a second terminal of the transistor to a voltage source; and means for maintaining substantially equal voltages across first and second terminals of a resistive load disposed between the second terminal of the transistor and the output terminal of the amplifier. The voltage source receiving the current may be at the ground potential. The transistor is optionally maintained in an active region of operation.

In one embodiment, the transistor is an MOS transistor. In another embodiment, the transistor is a bipolar transistor. The resistive load may be resistor, an MOS transistor or a bipolar transistor. The amplifier may be a transimpedance amplifier used in a sensor. The sensor may be the reader head of a data storage media driver.

In accordance with another embodiment of the present invention, a differential amplifier includes, in part, first and second feedback circuits. The first feedback circuit is disposed across a first input terminal of the amplifier and a first output terminal of the amplifier and includes a first transistor; a first current source supplying a first current to a first terminal of the first transistor, the first current source being in communication with the first input terminal of the amplifier; a second current source receiving the first current from a second terminal of the first transistor and supplying the received current to a voltage source; and a first resistive load having a first terminal in communication with the second terminal of the transistor and a second terminal in communication with the first output terminal of the amplifier. The first and second terminals of the first resistive load have DC voltages characterized substantially by a first value. The second feedback circuit is disposed across a second input terminal of the amplifier and a second output terminal of the amplifier. The second feedback circuit includes a second transistor; a third current source supplying a second current to a first terminal of the second transistor, the third current source being in communication with the second input terminal of the amplifier; a fourth current source receiving the second current from a second terminal of the second transistor and supplying the received second current to a voltage source; and a second resistive load having a first terminal in communication with the second terminal of the second transistor and a second terminal in communication with the second output terminal of the amplifier. The first and second terminals of the second resistive load have DC voltages characterized substantially by a second value.

In accordance with another embodiment of the present invention, a method of reducing DC component of feedback signals flowing through a pair of feedback circuits disposed across a pair of input terminals and a pair of output terminals of an amplifier includes supplying a first current to a first terminal of a first transistor, the first terminal being in communication with a first input terminal of the amplifier; flowing the first current from a second terminal of the first transistor to a first voltage source; supplying a second current to a first terminal of a second transistor, the first terminal of the second transistor being in communication with a second input terminal of the amplifier; flowing the second current from a second terminal of the second transistor to a second voltage source; maintaining substantially equal voltages across first and second terminals of a first resistive load disposed between the second terminal of the first transistor and a first output terminal of the amplifier; and maintaining substantially equal voltages across first and second terminals of a second resistive load disposed between the second terminal of the second transistor and a second output terminal of the amplifier.

In accordance with another embodiment of the present invention, an electronic system includes a storage media driver having disposed therein a reader head; a transimpedance amplifier responsive to the reader head; and a feedback circuit disposed between the input and output terminals of the transimpedance amplifier. The feedback circuit includes a transistor; a first current source supplying a first current to a first terminal of the transistor, the first current source being in communication with an input terminal of the transimpedance amplifier; a second current source receiving the first current from a second terminal of the transistor and supplying the received current to a voltage source; and a resistive load having a first terminal in communication with the second terminal of the transistor and a second terminal in communication with an output terminal of the transimpedance amplifier. The first and second terminals of the resistive load have DC voltages characterized substantially by a same value. The transistor is maintained in an active region of operation.

DETAILED DESCRIPTION OF THE INVENTION

Figure 2A:
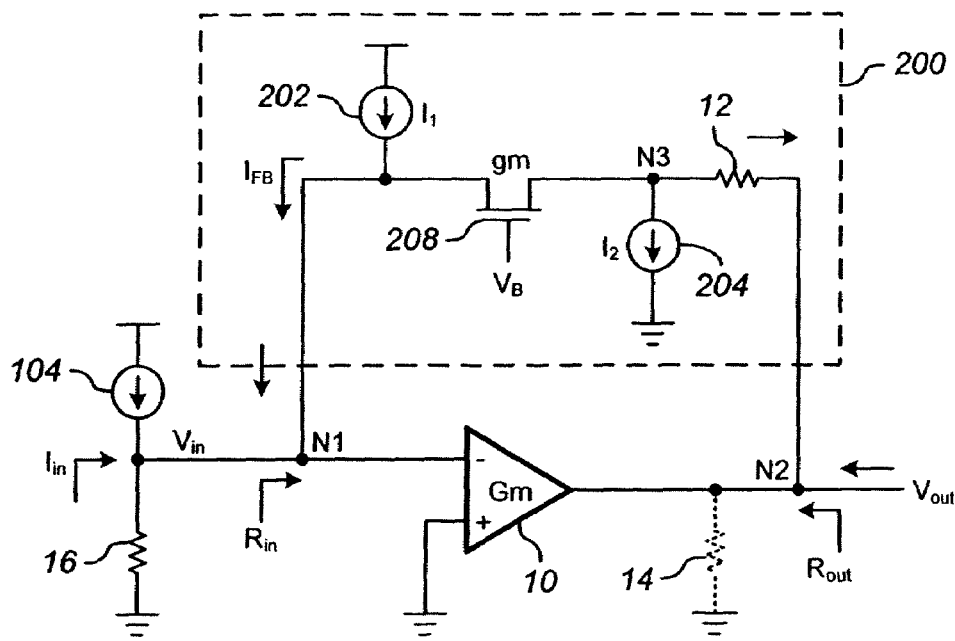
FIG. 2A is a schematic diagram of a closed-loop transimpedance amplifier, in accordance with one embodiment of the present invention.

FIG. 2A shows a transimpedance amplifier 10 with a feedback circuit 200, in accordance with one embodiment of the present invention, that has a reduced effect on the DC operating point of a sensor represented by input resistor 16. Feedback loop 200 is shown as including current sources 202, 204, resistive load 12, and transistor 208. Current source 18 is used to establish the DC biasing point of the reader head. In FIG. 2A, transistor 208 is shown as being an MOS transistor. It is understood, however, that transistor 208 may be a bipolar or any other kind of transistor. The sensor may be the reader head of a storage media driver.

Current sources 202 and 204 supply the same amount of current. Current source 202 supplies current $I_1$ to one of the terminals of transistor 208. Current source 204 diverts the current it receives from the other terminal of transistor 208 to a voltage source, e.g., the ground. Current $I_1$ is selected such that transistor 208 operates in the active region. Accordingly, if transistor 208 is selected to be an MOS transistor it operates in the saturation region. If transistor 208 is selected to be a bipolar transistor, it operates in the forward active region. Voltage VB applied to the gate terminal of common-gate transistor 208 is selected such that the voltage at the source terminal of transistor 208, i.e., the voltage at node N3, is substantially equal to the output voltage Vout of amplifier 10, i.e., the voltage at node N2. Accordingly, no DC current is enabled to flow through resistive load 12.

Under ideal conditions, the DC current supplied by current source 202 flows through transistor 208 and current source 204, and the voltage drop across resistive load 12 is maintained at zero. Accordingly, under such conditions, no DC current is enabled to flow to the input terminal of amplifier 10 via the feedback loop 200. In accordance with the present invention, even under non-ideal conditions, the DC component of the feedback current $I_{FB}$ is substantially reduced and is lower than that of the prior art circuit shown in FIG. 1. Because the DC component of the feedback current $I_{FB}$ of the present invention has a negligible value compared to the current supplied by current source 18, the DC component of feedback current $I_{FB}$ has a substantially reduced effect on the DC operating point of the sensor represented by resistor 16.

As shown below, the small-signal operation of the circuit shown in FIG. 2A is substantially equivalent to that of prior art circuit shown in FIG. 1. Referring to FIG. 2A, the input impedance as seen from input node N1 is defined approximately by the following expression:

$$R_{in} = \frac{1}{G_m} + \frac{1}{g_m \times G_m \times R_{14}} + \frac{R_{12}}{G_m \times R_{14}} \quad (4)$$

where $G_m$ represents the current-to-voltage gain of the amplifier, and $g_m$ represents the small signal gain of transistor 208. The term $G_m \times R_{14}$ is a relatively large number. Furthermore, by increasing current I1, the small signal gain of transistor 208, namely $g_m$, may be made relatively large. Accordingly, because the term $$\frac{1}{g_m \times G_m \times R_{14}}$$

is negligible, the input impedance $R_{in}$ may further be approximated by the following expression:

$$R_{in} = \frac{1}{G_m} + \frac{R_{12}}{G_m \times R_{14}} \quad (5)$$

Figure 1:
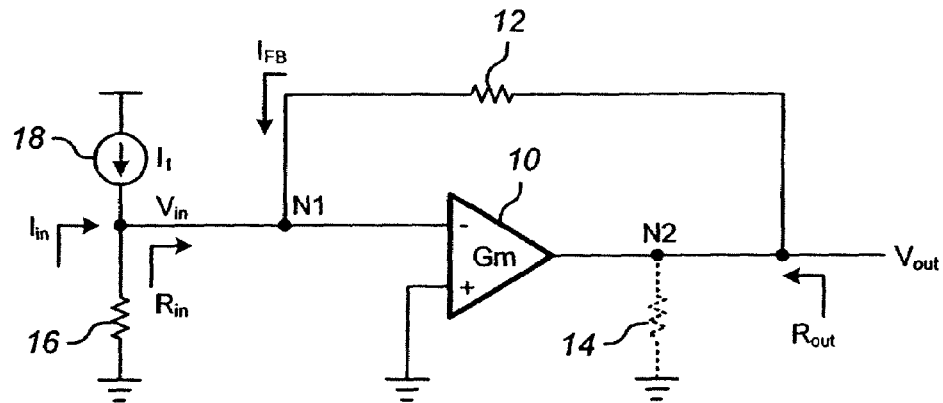
FIG. 1 is a schematic diagram of a closed-loop transimpedance amplifier, as known in the prior art.

Comparing expressions (5) and (1), it is seen that the small-signal input impedance of the closed-loop amplifier of the present invention, shown in FIG. 2A, is approximately equal to that of the prior art closed-loop amplifier, shown in FIG. 1.

The output impedance of the closed-loop amplifier of the present invention as seen from output node N2 is defined approximately by the following expression:

$$R_{out} = \frac{1}{G_m \times g_m \times r_o} \quad (6)$$

where $r_o$ represents the drain-to-source resistance of transistor 208. As noted above, the term $$\frac{1}{g_m \times G_m \times R_{14}}$$

has a relatively very small value. Therefore, the output impedance of the closed-loop amplifier of the present invention is advantageously smaller than that of the prior art closed-loop amplifier shown in FIG. 1.

The transimpedance, i.e., the voltage-to-current gain, of the closed-loop amplifier of the present invention is defined approximately by the following expression:

$$\frac{V_{out}}{I_{in}} = -\left(R_{12} + \frac{1}{g_m}\right) \quad (7)$$

As described above, by increasing the current $I_1$, $g_m$ may be selected to have a relatively large value. Therefore, the transimpedance of the closed-loop amplifier of the present invention may further be approximated by the following expression:

$$\frac{V_{out}}{I_{in}} = -R_{12} \quad (8)$$

Comparing expressions (8) and (3), it is seen that the small-signal gain of the closed-loop amplifier of the present invention is approximately equal to that of prior art closed-loop amplifier shown in FIG. 1.

In one exemplary embodiment, if current $I_1$ flowing through current source 202 is selected to be, for example, 125 µA, the voltage across resistor 12 is, for example, 1.5 mv, and current $I_{FB}$ has a value of, for example, 1.8 µA. Current $I_{FB}$ in the conventional transimpedance amplifier 10, however, may have a value of, for example, 90 µA, when a voltage of, for example, 0.45v appears across resistor 12.

Figure 2B:
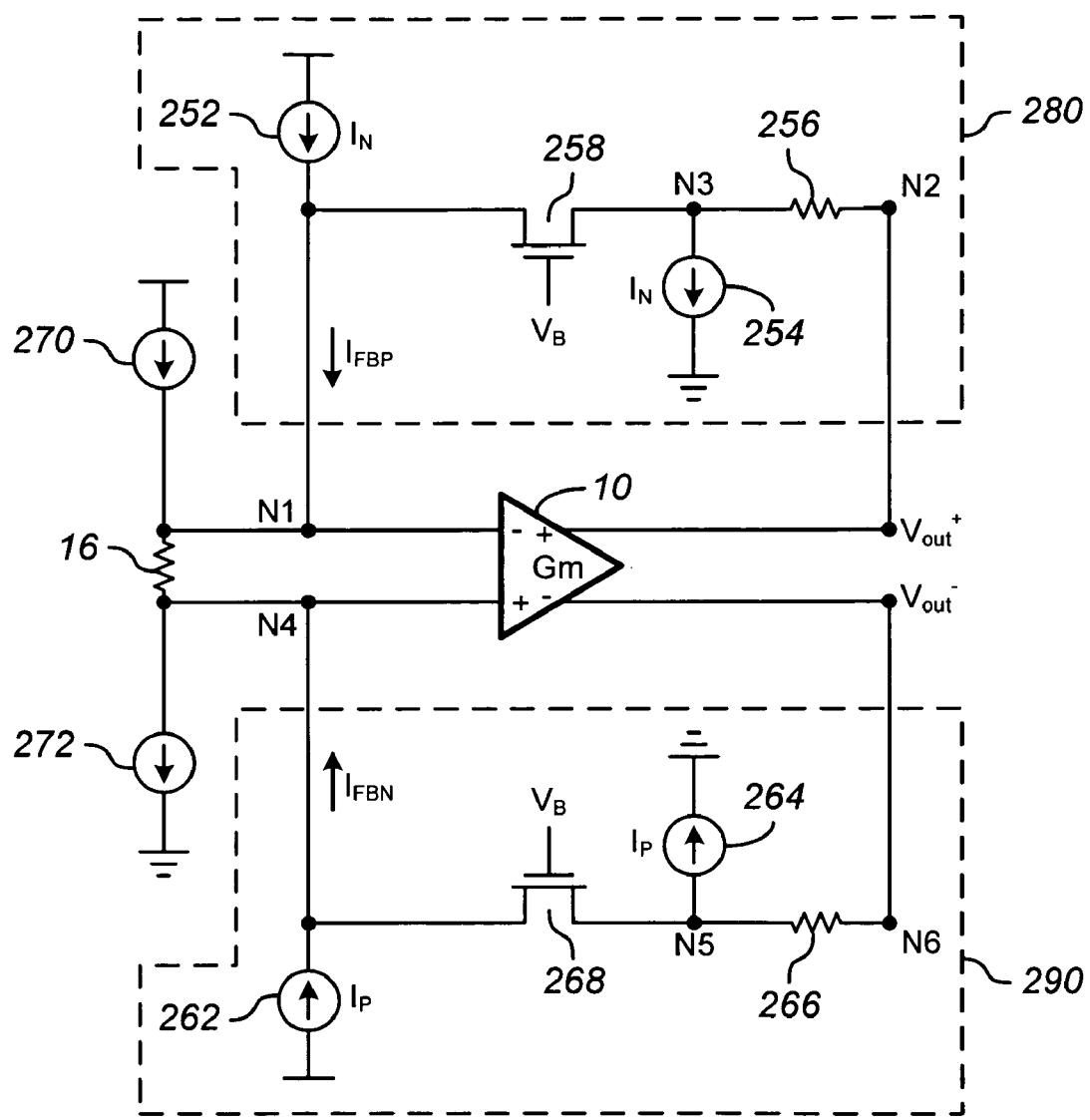
FIG. 2B is a schematic diagram of a closed-loop transimpedance amplifier, in accordance with another embodiment of the present invention.

FIG. 2B shows a differential transimpedance amplifier 10 having a first feedback circuit 280 disposed across its differentially positive output terminal and its negative input terminal, and a second feedback circuit 290 disposed across its differentially negative output terminal and its positive input terminal, in accordance with another embodiment of the present invention. Feedback loop 280 is shown as including current sources 252, 254, resistive load 256, and transistor 258. Feedback loop 290 is shown as including current sources 262, 264, resistive load 266, and transistor 268. Transistors 258 and 268 are shown as being MOS transistors. It is understood, however, that transistors 258 and 268 may be bipolar or any other kind of transistors.

Referring to feedback loop 280, current sources 252 and 254 supply the same amount of current. Current source 252 supplies current $I_N$ to one of the terminals of transistor 258. Current source 254 diverts the current it receives from the other terminal of transistor 258 to a voltage source, e.g., the ground. Current $I_N$ is selected such that transistor 258 operates in the active region. Accordingly, if transistor 258 is selected to be an MOS transistor it operates in the saturation region. If transistor 258 is selected to be a bipolar transistor, it operates in the forward active region. Voltage VB applied to the gate terminal of common-gate transistor 258 is selected such that the voltage at the source terminal of transistor 258, i.e., the voltage at node N3, is substantially equal to the output voltage $V_{OUT}^+$ of amplifier 10, i.e., the voltage at node N2. Accordingly, no DC current is enabled to flow through resistive load 256. Current sources 270 and 272 are used to establish the DC biasing point of the sensor represented by resistive load 16.

Referring to feedback loop 290, current sources 262 and 264 supply the same amount of current. Current source 262 supplies current $I_P$ to one of the terminals of transistor 268. Current source 264 diverts the current it receives from the other terminal of transistor 268 to a voltage source, e.g., the ground. Current $I_P$ is selected such that transistor 268 operates in the active region. Accordingly, if transistor 268 is selected to be an MOS transistor it operates in the saturation region. If transistor 268 is selected to be a bipolar transistor, it operates in the forward active region. Voltage VB applied to the gate terminal of common-gate transistor 268 is selected such that the voltage at the source terminal of transistor 268, i.e., the voltage at node N5, is substantially equal to the output voltage $V_{OUT}$ of amplifier 10, i.e., the voltage at node N6. Accordingly, no DC current is enabled to flow through resistive load 266.

Under ideal conditions, the DC current supplied by current source 252 flows through transistor 258 and current source 254, and the voltage drop across resistive load 256 is maintained at zero. Accordingly, under such conditions, no DC current is enabled to flow to the negative input terminal of amplifier 10 via the feedback loop 280. Similarly, under ideal conditions, the DC current supplied by current source 262 flows through transistor 268 and current source 264, and the voltage drop across resistive load 266 is maintained at zero. Accordingly, under such conditions, no DC current is enabled to flow to the positive input terminal of amplifier 10 via the feedback loop 290.

In accordance with the present invention, even under non-ideal conditions, the DC components of the feedback currents $I_{FBP}$ and $I_{FBP}$ are substantially reduced. Because the DC component of the feedback current $I_{FBP}$ of the present invention has a negligible value compared to the current supplied by current source 270, the DC component of feedback current $I_{FBP}$ has a substantially reduced effect on the DC operating point of the sensor represented by resistor 16. Similarly, because the DC component of the feedback current $I_{FBN}$ of the present invention has a negligible value compared to the current supplied by current source 272, the DC component of feedback current $I_{FBN}$ has a substantially reduced effect on the DC operating point of the sensor. The small-signal analysis provided above with respect to FIG. 2A is also applicable to FIG. 2B.

Figure 3A:
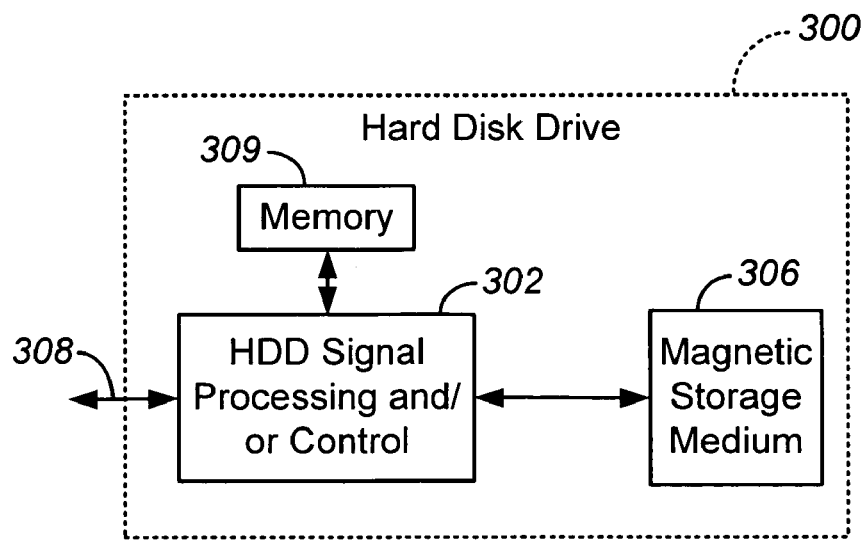
FIGS. 3A-3H show various devices in which the present invention may be embodied.

Referring now to FIGS. 3A-3G, various exemplary implementations of the present invention are shown. Referring to FIG. 3A, the present invention may be embodied in a hard disk drive 300. The present invention may implement either or both signal processing and/or control circuits, which are generally identified in FIG. 3A at 302. In some implementations, signal processing and/or control circuit 302 and/or other circuits (not shown) in HDD 300 may process data, perform coding and/or encryption, perform calculations, and/or format data that is output to and/or received from a magnetic storage medium 306.

HDD 300 may communicate with a host device (not shown) such as a computer, mobile computing devices such as personal digital assistants, cellular phones, media or MP3 players and the like, and/or other devices via one or more wired or wireless communication links 308. HDD 300 may be connected to memory 309, such as random access memory (RAM), a low latency nonvolatile memory such as flash memory, read only memory (ROM) and/or other suitable electronic data storage.

Figure 3B:
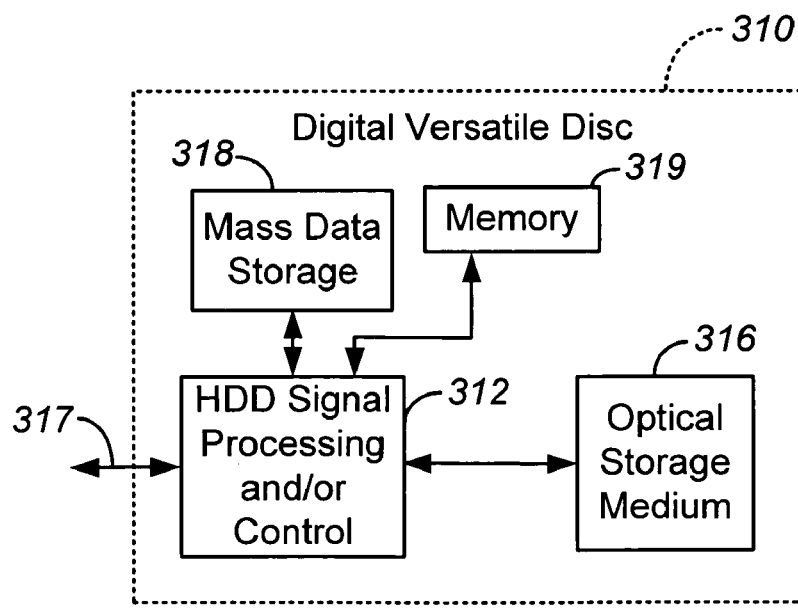

Referring now to FIG. 3B, the present invention may be embodied in a digital versatile disc (DVD) drive 310. The present invention may implement either or both signal processing and/or control circuits, which are generally identified in FIG. 3B at 312, and/or mass data storage 318 of DVD drive 310. Signal processing and/or control circuit 312 and/or other circuits (not shown) in DVD 310 may process data, perform coding and/or encryption, perform calculations, and/or format data that is read from and/or data written to an optical storage medium 316: In some implementations, signal processing and/or control circuit 312 and/or other circuits (not shown) in DVD 310 can also perform other functions such as encoding and/or decoding and/or any other signal processing functions associated with a DVD drive.

DVD drive 33 may communicate with an output device (not shown) such as a computer, television or other device via one or more wired or wireless communication links 317. DVD 310 may communicate with mass data storage 318 that stores data in a nonvolatile manner. Mass data storage 318 may include a hard disk drive (HDD) such as that shown in FIG. 3A. The HDD may be a mini HDD that includes one or more platters having a diameter that is smaller than approximately 1.8"DVD 310 may be connected to memory 319, such as RAM, ROM, low latency nonvolatile memory such as flash memory, and/or other suitable electronic data storage.

Figure 3C:
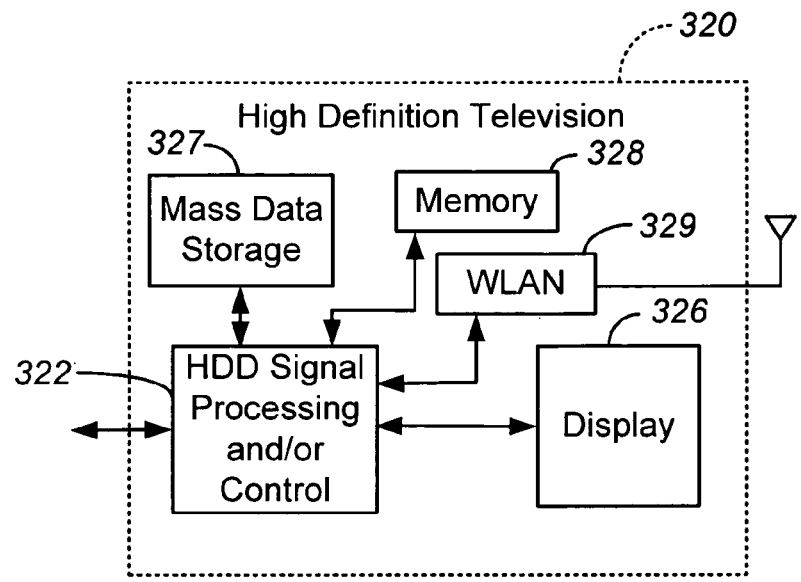

Referring now to FIG. 3C, the present invention may be embodied in a high definition television (HDTV) 320. The present invention may implement either or both signal processing and/or control circuits, which are generally identified in FIG. 3C at 322, a WLAN interface and/or mass data storage of the HDTV 320. HDTV 320 receives HDTV input signals in either a wired or wireless format and generates HDTV output signals for a display 326. In some implementations, signal processing circuit and/or control circuit 322 and/or other circuits (not shown) of HDTV 320 may process data, perform coding and/or encryption, perform calculations, format data and/or perform any other type of HDTV processing that may be required.

HDTV 320 may communicate with mass data storage 327 that stores data in a nonvolatile manner such as optical and/or magnetic storage devices. At least one HDD may have the configuration shown in FIG. 3A and/or at least one DVD may have the configuration shown in FIG. 3B. The HDD may be a mini HDD that includes one or more platters having a diameter that is smaller than approximately 1.8" HDTV 320 may be connected to memory 328 such as RAM, ROM, low latency nonvolatile memory such as flash memory and/or other suitable electronic data storage. HDTV 320 also may support connections with a WLAN via a WLAN network interface 329.

Figure 3D:
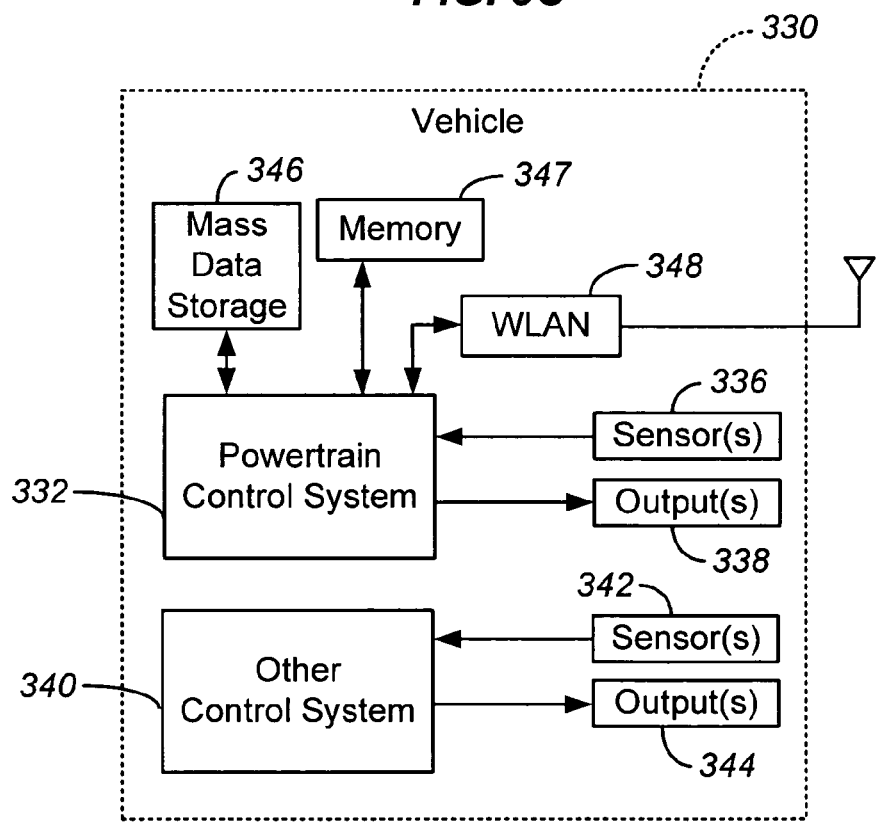

Referring now to FIG. 3D, the present invention implements a control system of a vehicle 330, a WLAN interface and/or mass data storage of the vehicle control system. In some implementations, the present invention implements a powertrain control system 332 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 340 of vehicle 330. Control system 340 may likewise receive signals from input sensors 342 and/or output control signals to one or more output devices 344. In some implementations, control system 340 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 332 may communicate with mass data storage 346 that stores data in a nonvolatile manner. Mass data storage 346 may include optical and/or magnetic storage devices for example hard disk drives HDD and/or DVDs. At least one HDD may have the configuration shown in FIG. 3A and/or at least one DVD may have the configuration shown in FIG. 3B. The HDD may be a mini HDD that includes one or more platters having a diameter that is smaller than approximately 1.8" Powertrain control system 332 may be connected to memory 347 such as RAM, ROM, low latency nonvolatile memory such as flash memory and/or other suitable electronic data storage. Powertrain control system 332 also may support connections with a WLAN via a WLAN network interface 348. The control system 340 may also include mass data storage, memory and/or a WLAN interface (all not shown).

Figure 3E:
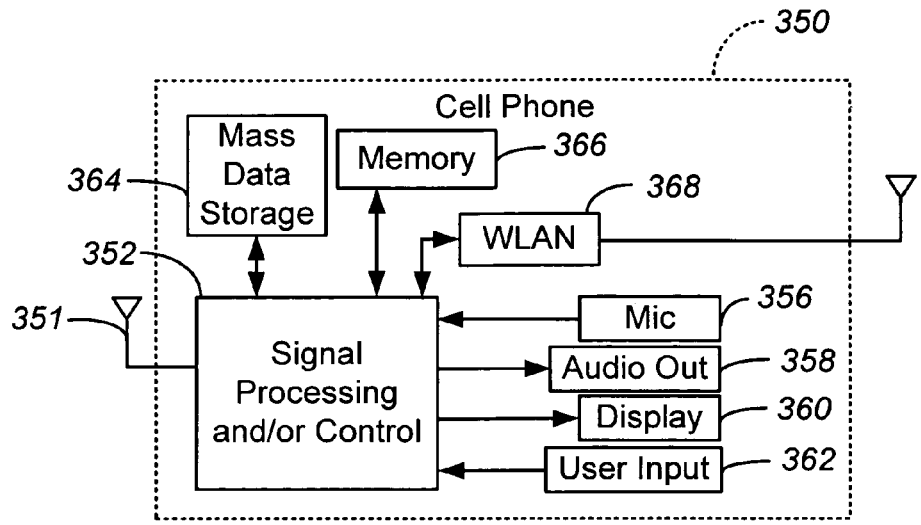

Referring now to FIG. 3E, the present invention may be embodied in a cellular phone 350 that may include a cellular antenna 351. The present invention may implement either or both signal processing and/or control circuits, which are generally identified in FIG. 3E at 352, a WLAN interface and/or mass data storage of the cellular phone 350. In some implementations, cellular phone 350 includes a microphone 356, an audio output 358 such as a speaker and/or audio output jack, a display 360 and/or an input device 362 such as a keypad, pointing device, voice actuation and/or other input device. Signal processing and/or control circuits 352 and/or other circuits (not shown) in cellular phone 350 may process data, perform coding and/or encryption, perform calculations, format data and/or perform other cellular phone functions.

Cellular phone 350 may communicate with mass data storage 364 that stores data in a nonvolatile manner such as optical and/or magnetic storage devices for example hard disk drives HDD and/or DVDs. At least one HDD may have the configuration shown in FIG. 3A and/or at least one DVD may have the configuration shown in FIG. 3B. The HDD may be a mini HDD that includes one or more platters having a diameter that is smaller than approximately 1.8". Cellular phone 350 may be connected to memory 366 such as RAM, ROM, low latency nonvolatile memory such as flash memory and/or other suitable electronic data storage. Cellular phone 350 also may support connections with a WLAN via a WLAN network interface 368.

Figure 3F:
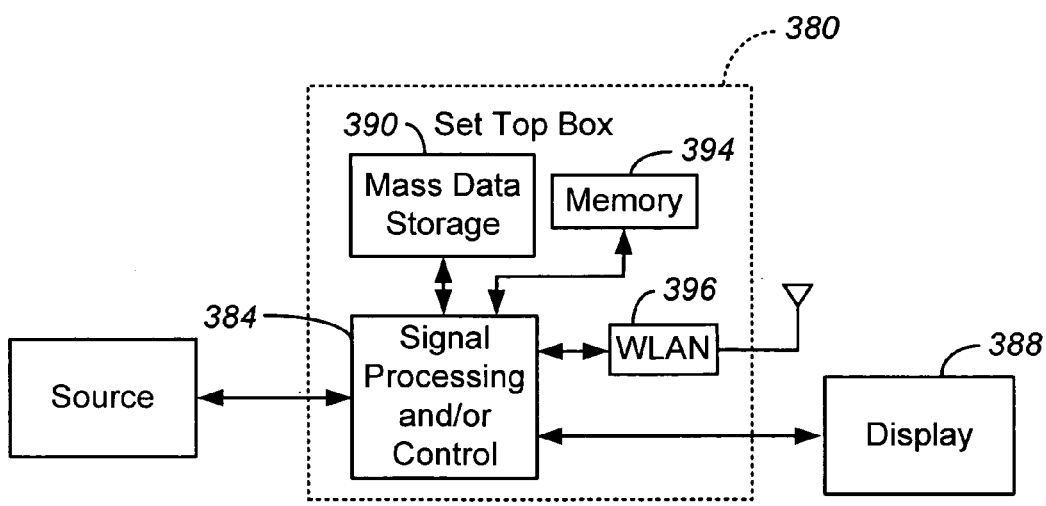

Referring now to FIG. 3F, the present invention may be embodied in a set top box 380. The present invention may implement either or both signal processing and/or control circuits, which are generally identified in FIG. 3F at 384, a WLAN interface and/or mass data storage of the set top box 380. Set top box 380 receives signals from a source such as a broadband source and outputs standard and/or high definition audio/video signals suitable for a display 388 such as a television and/or monitor and/or other video and/or audio output devices. Signal processing and/or control circuits 384 and/or other circuits (not shown) of the set top box 380 may process data, perform coding and/or encryption, perform calculations, format data and/or perform any other set top box function.

Set top box 380 may communicate with mass data storage 390 that stores data in a nonvolatile manner. Mass data storage 390 may include optical and/or magnetic storage devices for example hard disk drives HDD and/or DVDs. At least one HDD may have the configuration shown in FIG. 3A and/or at least one DVD may have the configuration shown in FIG. 3B. The HDD may be a mini HDD that includes one or more platters having a diameter that is smaller than approximately 1.8" Set top box 380 may be connected to memory 394 such as RAM, ROM, low latency nonvolatile memory such as flash memory and/or other suitable electronic data storage. Set top box 380 also may support connections with a WLAN via a WLAN network interface 396.

Figure 3G:
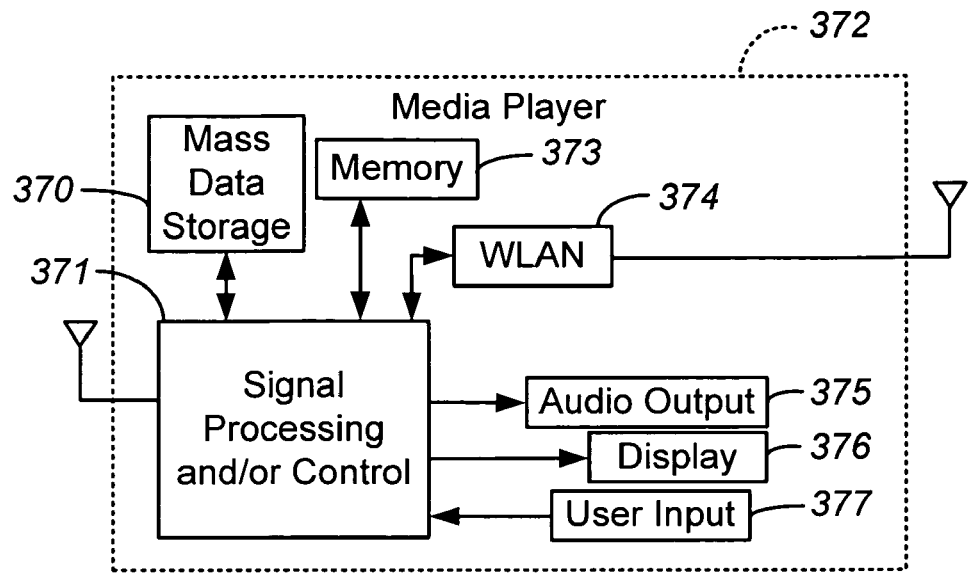

Referring now to FIG. 3G, the present invention may be embodied in a media player 372. The present invention may implement either or both signal processing and/or control circuits, which are generally identified in FIG. 3G at 371, a WLAN interface and/or mass data storage of the media player 372. In some implementations, media player 372 includes a display 376 and/or a user input 377 such as a keypad, touchpad and the like. In some implementations, media player 372 may employ a graphical user interface (GUI) that typically employs menus, drop down menus, icons and/or a point-and-click interface via display 376 and/or user input 377. Media player 372 further includes an audio output 375 such as a speaker and/or audio output jack. Signal processing and/or control circuits 371 and/or other circuits (not shown) of media player 372 may process data, perform coding and/or encryption, perform calculations, format data and/or perform any other media player function.

Media player 372 may communicate with mass data storage 370 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 3A and/or at least one DVD may have the configuration shown in FIG. 3B. The HDD may be a mini HDD that includes one or more platters having a diameter that is smaller than approximately 1.8" Media player 372 may be connected to memory 373 such as RAM, ROM, low latency nonvolatile memory such as flash memory and/or other suitable electronic data storage. Media player 372 also may support connections with a WLAN via a WLAN network interface 374.

Figure 3H:
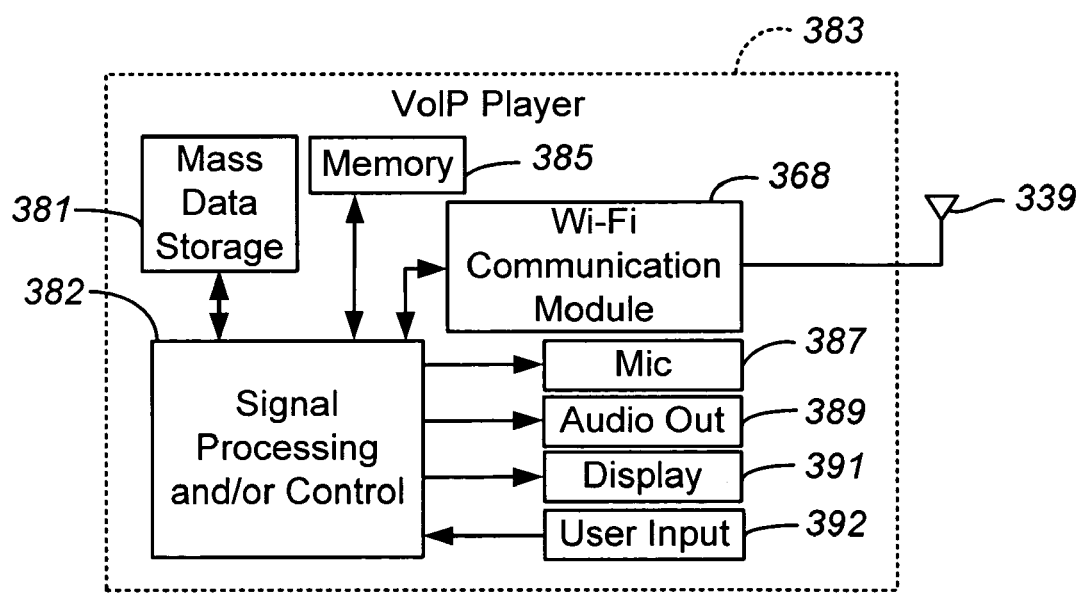

Referring to FIG. 3H, the present invention may be embodied in a Voice over Internet Protocol (VoIP) phone 383 that may include an antenna 339. The present invention may implement either or both signal processing and/or control circuits, which are generally identified in FIG. 3H at 382, a wireless interface and/or mass data storage of the VoIP phone 383. In some implementations, VoIP phone 383 includes, in part, a microphone 387, an audio output 389 such as a speaker and/or audio output jack, a display monitor 391, an input device 392 such as a keypad, pointing device, voice actuation and/or other input devices, and a Wireless Fidelity (Wi-Fi) communication module 386. Signal processing and/or control circuits 382 and/or other circuits (not shown) in VoIP phone 383 may process data, perform coding and/or encryption, perform calculations, format data and/or perform other VoIP phone functions.

VoIP phone 383 may communicate with mass data storage 502 that stores data in a nonvolatile manner such as optical and/or magnetic storage devices, for example hard disk drives HDD and/or DVDs. At least one HDD may have the configuration shown in FIG. 3A and/or at least one DVD may have the configuration shown in FIG. 3B. The HDD may be a mini HDD that includes one or more platters having a diameter that is smaller than approximately 1.8". VoIP phone 383 may be connected to memory 385, which may be a RAM, ROM, low latency nonvolatile memory such as flash memory and/or other suitable electronic data storage. VoIP phone 383 is configured to establish communications link with a VoIP network (not shown) via Wi-Fi communication module 386. Still other implementations in addition to those described above are contemplated.

The above embodiments of the present invention are illustrative and not limitative. Various alternatives and equivalents are possible. The invention is not limited by the type of amplifier, or transistor. The invention is not limited by the type of integrated circuit in which the present disclosure may be disposed. Nor is the invention limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A feedback circuit disposed across an input terminal and an output terminal of an amplifier, the feedback circuit comprising:
   a transistor;
   a first current source supplying a current to a first terminal of the transistor, said first current source being in communication with the input terminal of the amplifier;
   a second current source receiving the current from a second terminal of the transistor and supplying the received current to a voltage source;
   a resistive load having a first terminal in communication with the second terminal of the transistor and a second terminal in communication with the output terminal of the amplifier; said first and second terminals of the resistive load having DC voltages characterized substantially by a same value.

2. The feedback circuit of claim 1 wherein said transistor is an MOS transistor of a first conductivity type.

3. The feedback circuit of claim 1 wherein said transistor is a bipolar transistor.

4. The feedback circuit of claim 1 wherein said transistor is maintained in an active region of operation.

5. The feedback circuit of claim 1 wherein said resistive load is a resistor.

6. The feedback circuit of claim 1 wherein said resistive load is an MOS transistor of a first conductivity type.

7. The feedback circuit of claim 1 wherein said resistive load is a bipolar transistor.

8. The feedback circuit of claim 1 further comprising:
   a sensor in communication with the amplifier; and
   a biasing current adapted to bias the sensor.

9. The feedback circuit of claim 8 wherein said sensor is a reader head.

10. The feedback circuit of claim 1 wherein said amplifier is a transimpedance amplifier.

11. The feedback circuit of claim 1 wherein said voltage source is a ground potential.

12. A method of reducing DC component of a feedback signal flowing through a feedback circuit disposed across an input terminal and an output terminal of an amplifier, the method comprising:
   supplying a current to a terminal of a transistor; said terminal being in communication with the input terminal of the amplifier;
   flowing the current from a second terminal of the transistor to a voltage source; and
   maintaining substantially equal voltages across first and second terminals of a resistive load disposed between the second terminal of the transistor and the output terminal of the amplifier.

13. The method of claim 12 wherein said transistor is an MOS transistor of a first conductivity type.

14. The method of claim 12 wherein said transistor is a bipolar transistor.

15. The method of claim 12 further comprising:
   maintaining said transistor in an active region of operation.

16. The method of claim 12 wherein said resistive load is a resistor.

17. The method of claim 12 wherein said resistive load is an MOS transistor of a first conductivity type.

18. The method of claim 12 wherein said resistive load is a bipolar transistor.

19. The method of claim 12 further comprising:
   coupling a sensor to the amplifier; and
   biasing the sensor.

20. The method of claim 19 wherein said sensor is a reader head.

21. The method of claim 12 wherein said amplifier is a transimpedance amplifier.

22. The method of claim 12 wherein said voltage source is a ground potential.

23. A feedback circuit disposed across an input terminal and an output terminal of an amplifier, the feedback circuit comprising:
   means for supplying a current to a first terminal of a transistor, said means being in communication with the input terminal of the amplifier;
   means for flowing the current from a second terminal of the transistor to a voltage supply; and
   means for maintaining substantially equal voltages across first and second terminals of a resistive load disposed between the second terminal of the transistor and the output terminal of the amplifier.

24. The feedback of claim 23 wherein said transistor is an MOS transistor of a first conductivity type.

25. The feedback of claim 23 wherein said transistor is a bipolar transistor.

26. The feedback of claim 23 wherein said transistor is maintained in an active region of operation.

27. The feedback of claim 23 wherein said resistive load is a resistor.

28. The feedback of claim 23 wherein said resistive load is an MOS transistor of a first conductivity type.

29. The feedback of claim 23 wherein said resistive load is a bipolar transistor.

30. The feedback of claim 23 further comprising:
   means for reading a storage media maintained in communication with the amplifier; and
   means for biasing the reading means.

31. The feedback of claim 23 wherein said amplifier is a transimpedance amplifier.

32. The feedback of claim 23 wherein said voltage source is a ground potential.

33. A differential amplifier comprising:
   a first feedback circuit disposed across a first input terminal of the amplifier and a first output terminal of the amplifier, the first feedback circuit comprising:
      a first transistor;
      a first current source supplying a first current to a first terminal of the first transistor, said first current source being in communication with the first input terminal of the amplifier;
      a second current source receiving the first current from a second terminal of the first transistor and supplying the received current to a voltage source; and
      a first resistive load having a first terminal in communication with the second terminal of the transistor and a second terminal in communication with the first output terminal of the amplifier; said first and second terminals of the first resistive load having DC voltages characterized substantially by a first value; and a second feedback circuit disposed across a second input terminal of the amplifier and a second output terminal of the amplifier, the second feedback circuit comprising:
a second transistor;
a third current source supplying a second current to a first terminal of the second transistor, said third current source being in communication with the second input terminal of the amplifier;
a fourth current source receiving the second current from a second terminal of the second transistor and supplying the received second current to a voltage source; and
a second resistive load having a first terminal in communication with the second terminal of the second transistor and a second terminal in communication with the second output terminal of the amplifier; said first and second terminals of the second resistive load having DC voltages characterized substantially by a second value.

34. A method of reducing DC component of feedback signals flowing through a pair of feedback circuits disposed across a pair of input terminals and a pair of output terminals of an amplifier, the method comprising:
supplying a first current to a first terminal of a first transistor; said first terminal being in communication with a first input terminal of the amplifier;
flowing the first current from a second terminal of the first transistor to a first voltage source;
supplying a second current to a first terminal of a second transistor; said first terminal of the second transistor being in communication with a second input terminal of the amplifier;
flowing the second current from a second terminal of the second transistor to a second voltage source;
maintaining substantially equal voltages across first and second terminals of a first resistive load disposed between the second terminal of the first transistor and a first output terminal of the amplifier; and
maintaining substantially equal voltages across first and second terminals of a second resistive load disposed between the second terminal of the second transistor and a second output terminal of the amplifier.

35. A system comprising:
a storage media driver having disposed therein a reader head;
a transimpedance amplifier responsive to the reader head; and
a feedback circuit disposed between the input and output terminals of the transimpedance amplifier, said feedback circuit comprising:
a transistor;
a first current source supplying a first current to a first terminal of the transistor, said first current source being in communication with an input terminal of the transimpedance amplifier;
a second current source receiving the first current from a second terminal of the transistor and supplying the received current to a voltage source; and
a resistive load having a first terminal in communication with the second terminal of the transistor and a second terminal in communication with an output terminal of the transimpedance amplifier; said first and second terminals of the resistive load having DC voltages characterized substantially by a same value, said transistor being maintained in an active region of operation.

* * * * *

UNITED STATES PATENT AND TRADEMARK OFFICE
CERTIFICATE OF CORRECTION

| | | |
|---|---|---|
| PATENT NO. | : 7,372,329 B1 | |
| APPLICATION NO. | : 11/505555 | |
| DATED | : May 13, 2008 | |
| INVENTOR(S) | : Ben Wee-Guan Tan | |

It is certified that error appears in the above-identified patent and that said Letters Patent is hereby corrected as shown below:

<u>On the Title Page</u>

In column 2, line 2, item (57) under "ABSTRACT", after "adapted so as not" insert --to--.

Signed and Sealed this

Ninth Day of September, 2008

JON W. DUDAS
*Director of the United States Patent and Trademark Office*